United States Patent
Katz et al.

(10) Patent No.: US 6,677,712 B2
(45) Date of Patent: Jan. 13, 2004

(54) GAS DISTRIBUTION PLATE ELECTRODE FOR A PLASMA RECEPTOR

(75) Inventors: Dan Katz, Agoura Hills, CA (US); Douglas A. Buchberger, Jr., Livermore, CA (US); Yan Ye, Saratoga, CA (US); Robert B. Hagen, Newark, CA (US); Xiaoye Zhao, Mountain View, CA (US); Ananda H. Kumar, Fremont, CA (US); Kang-Lie Chiang, San Jose, CA (US); Hamid Noorbakhsh, Fremont, CA (US); Shiang-Bau Wang, Hsinchu (TW)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 10/442,386

(22) Filed: May 20, 2003

(65) Prior Publication Data

US 2003/0201723 A1 Oct. 30, 2003

Related U.S. Application Data

(63) Continuation of application No. 10/027,732, filed on Dec. 19, 2001, now Pat. No. 6,586,886.

(51) Int. Cl.$^7$ .............................. H01J 7/24; C23F 1/00; C23C 14/00
(52) U.S. Cl. ............................ 315/111.21; 156/345.33; 204/298.33
(58) Field of Search ................ 315/111.21; 204/298.32, 204/298.33, 298.34, 298.39; 118/723 R, 723 MW, 728, 723 E; 156/345.23, 345.33, 345.43, 345.51

(56) References Cited

U.S. PATENT DOCUMENTS

| | | | | |
|---|---|---|---|---|
| 5,558,717 A | * | 9/1996 | Zhao et al. | 118/715 |
| 5,868,848 A | * | 2/1999 | Tsukamoto | 118/723 E |
| 6,352,591 B1 | * | 3/2002 | Yieh et al. | 118/697 |
| 6,364,949 B1 | * | 4/2002 | Or et al. | 118/69 |
| 2002/0069968 A1 | * | 6/2002 | Keller et al. | 156/345.33 |

* cited by examiner

*Primary Examiner*—Don Wong
*Assistant Examiner*—Thuy Vinh Tran
(74) *Attorney, Agent, or Firm*—Robert S. Stern

(57) ABSTRACT

The invention is embodied in a plasma reactor for processing a semiconductor wafer, the reactor having a gas distribution plate including a front plate in the chamber and a back plate on an external side of the front plate, the gas distribution plate comprising a gas manifold adjacent the back plate, the back and front plates bonded together and forming an assembly. The assembly includes an array of holes through the front plate and communicating with the chamber, at least one gas flow-controlling orifice through the back plate and communicating between the manifold and at least one of the holes, the orifice having a diameter that determines gas flow rate to the at least one hole. In addition, an array of pucks is at least generally congruent with the array of holes and disposed within respective ones of the holes to define annular gas passages for gas flow through the front plate into the chamber, each of the annular gas passages being non-aligned with the orifice.

14 Claims, 6 Drawing Sheets

GAS DISTRIBUTION PLATE ELECTRODE FOR A PLASMA RECEPTOR

CROSS REFERENCE TO RELATED APPLICATION

This patent application is a continuation of application Ser. No. 10/027,732 filed Dec. 19, 2001 which is now U.S. Pat. No. 6,586,886.

BACKGROUND OF THE INVENTION

Various types of plasma reactors employed in the manufacture of semiconductor microelectronic circuits require a large RF electrode at the reactor chamber ceiling that overlies the semiconductor workpiece. Typically, the workpiece is a semiconductor wafer supported on a conductive pedestal. RF power is applied to the support pedestal, and the ceiling or overhead electrode is a counter electrode. In some reactors, the RF power applied to the support pedestal is the plasma source power (determining plasma ion density) and is also the plasma bias power (determining ion energy at the wafer surface). In other reactors, an RF power applicator other than the wafer pedestal furnishes the plasma source power, while the RF power applied to the wafer pedestal serves only as plasma RF bias power. For example, the plasma source power may be applied by an inductive antenna or may be applied by the ceiling electrode. Thus, the ceiling electrode may either be a grounded counter electrode for the RF power applied to the wafer support pedestal or it may be connected to an independent RF power generator and function as an independent RF power applicator. In either case, the most uniform distribution of process gas is obtained by introducing the process gas through the ceiling. This requires that the ceiling electrode be a gas distribution plate.

There is a continuing need to improve the uniformity of process gas distribution across the wafer surface in a plasma reactor, particularly in a plasma reactor used for semiconductor etch processes as well as other semiconductor processes. This need arises from the ever-decreasing device geometries of microelectronic circuits and minimum feature sizes, some approaching 0.15 microns. Such small device geometries are dictated in most cases by the desire for higher microprocessor clock speeds, and require corresponding improvements in etch rates, etch uniformity across the wafer surface and damage-free etching. Previously, with devices having relatively large feature sizes, a single gas inlet in the plasma reactor overhead ceiling electrode/gas distribution plate provided adequate process gas distribution uniformity. A single inlet would necessarily be of a large size in order to meet the requisite gas flow requirements.

One problem with such a large inlet is that it is more susceptible to plasma entering the inlet and causing arcing or plasma light-up within the inlet. Such arcing damages the plate and/or enlarges the inlet and consumes power. Sputtering of the plate material around the inlet can also contaminate the plasma with byproducts of the sputtering. With a large hole, the maximum electric field occurs near the center of the hole, and this is the likeliest location for plasma light-up or arcing to begin. One solution proposed for reactors having a single gas inlet was to juxtapose a disk or puck in the center of the hole to keep gases away from the intense electric field at the hole center (U.S. Pat. No. 6,885,358 by Dan Maydan). However, with current device geometries incorporating very small feature sizes, much better process gas distribution uniformity across the wafer surface is required. As a result, a single gas distribution inlet or orifice in the ceiling gas distribution plate is inadequate to provide the requisite gas distribution uniformity. Thus, an overhead gas distribution plate is currently made by drilling thousands of fine holes or orifices through the plate. The spatial distribution of such a large number of orifices improves gas distribution uniformity across the wafer surface. The smaller size makes each hole less susceptible to plasma entering the hole.

Unfortunately, it has not been practical to place or hold an individual puck in the center of each one of the thousands of holes to ward the gas away from the high intensity electric fields near the hole centers. Thus, in order to reduce plasma arcing, the gas inlet holes must be of minimal diameter and within a small dimensional hole-to-hole tolerance to ensure uniform gas distribution. Drilling such a large number of holes is costly. This is because the holes must have such a high aspect ratio, must be drilled through very hard material (such as silicon carbide) and sharp hole edges must be avoided. Moreover, the very need for such accurately sized holes means that performance is easily degraded as hole sizes are enlarged by plasma sputtering of the hole edges. Depending upon plasma ion density distribution across the ceiling surface, some holes will be widened at a greater rate than other holes, so that a gas distribution plate initially having highly uniform gas distribution across the wafer surface eventually fails to provide the requisite uniformity.

Another problem is that the need for greater etch rate has dictated a smaller wafer-to-ceiling gap in order to obtain denser plasma. The small gas orifices produce very high velocity gas streams. The high velocity gas streams thus produced can be so narrowly collimated within the narrow wafer-to-ceiling gap that the hole-to-hole spacing in the gas distribution plate produces corresponding peaks and valleys in gas density at the wafer surface and corresponding non-uniformities in etch rate across the wafer surface.

As a result, there is a need for an overhead gas distribution plate that functions as an electrode or counter electrode, and that is not susceptible to plasma arcing in the gas injection passages, that does not have high gas injection velocities and in which the gas distribution uniformity and velocity are not affected by enlargement of the gas injection passages.

SUMMARY OF THE DISCLOSURE

The invention is embodied in a plasma reactor for processing a semiconductor wafer, the reactor having a gas distribution plate including a front plate in the chamber and a back plate on an external side of the front plate, the gas distribution plate comprising a gas manifold adjacent the back plate, the back and front plates bonded together and forming an assembly. The assembly includes an array of holes through the front plate and communicating with the chamber, at least one gas flow-controlling orifice through the back plate and communicating between the manifold and at least one of the holes, the orifice having a diameter that determines gas flow rate to the at least one hole. In addition, an array of pucks is at least generally congruent with the array of holes and disposed within respective ones of the holes to define annular gas passages for gas flow through the front plate into the chamber, each of the annular gas passages being non-aligned with the orifice.

DETAILED DESCRIPTION

Figure 1:
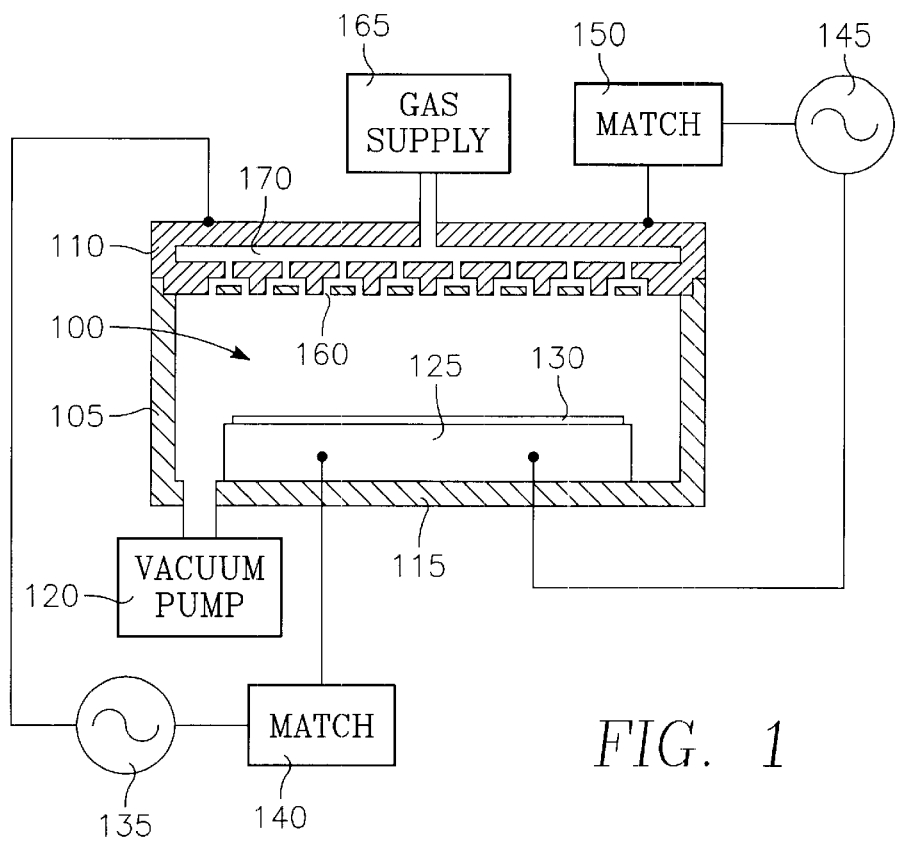
FIG. 1 is a simplified cut-away cross-sectional side view of a plasma reactor embodying the present invention.

Referring to FIG. 1, a plasma reactor includes a vacuum chamber 100 bounded by a reactor chamber cylindrical side wall 105, a ceiling 110 and floor 115. A vacuum pump 120 maintains a vacuum within the chamber at a desired chamber pressure. A wafer support pedestal 125 for supporting a semiconductor wafer or workpiece 130 is disposed at the bottom of the chamber 100 so that the wafer 130 faces the ceiling 110. The wafer support pedestal 125 has conductive elements so that the pedestal 125 can serve as an electrode or RF power applicator. For this purpose, an RF generator 135 is connected to the pedestal 125 through an RF impedance match circuit 140. The ceiling 110 is conductive in the illustrated embodiment and is connected to the RF return terminal of the RF generator 135 so that the ceiling 110 serves as a counter electrode for the wafer pedestal 125. In some types of reactors, another RF generator 145 may be connected to the ceiling 110 through an RF impedance match circuit 150, so that the ceiling 110 also serves as another RF power applicator. In this case, the frequencies of the two RF generators 135, 145 are very different so that the two RF generators 135, 145 function independently.

Figure 2A:
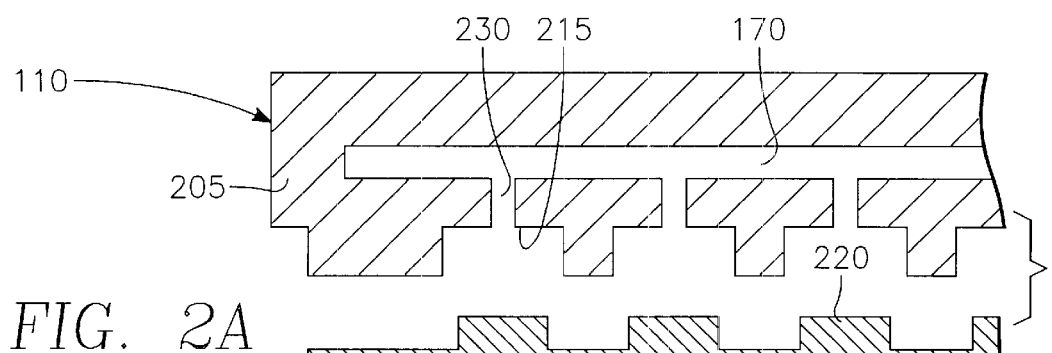
FIG. 2A is a partially exploded cross-sectional side view of a gas distribution plate of the plasma reactor of FIG. 1 in accordance with a first embodiment.
Figure 2B:
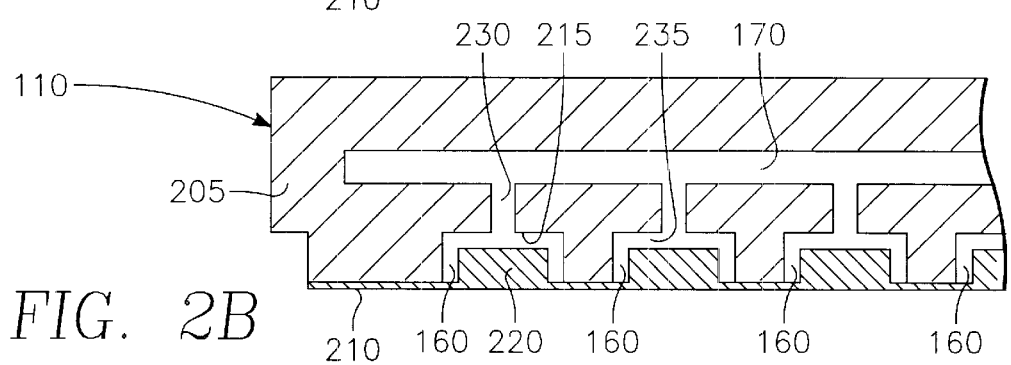
FIG. 2B is a side view of an assembled gas distribution plate of the plasma reactor corresponding to FIG. 2A.

Process gas is introduced so as to provide maximum gas distribution uniformity across the top surface of the wafer 130 by injecting it through many uniformly spaced gas injection inlets 160 in the ceiling 110. The ceiling 110 is thus a gas distribution plate. A gas source or supply 165 is coupled to a gas manifold 170 in the ceiling/gas distribution plate 110, and the gas manifold 170 feeds each of the inlets 160. As shown in FIGS. 2A and 2B, the inlets 160 of the gas distribution plate 110 are formed by two parallel planar plates, namely a back plate 205 and a front plate 210 which are manufactured separately (FIG. 2A) and then bonded together (FIG. 2B). The back plate 205 is on top and the front plate 210 is on the bottom and faces the plasma in the interior of the chamber 100. The back plate 205 consists of an array of relatively large cylindrical openings 215 in its bottom surface while the front plate 210 consists of an array of cylindrical pucks 220 matching the array of openings 215. As shown in FIG. 2B, the pucks 220 of the front plate 210 fit within the openings 215 of the back plate 205, the clearance between each opening 215 and matching puck 220 forming an annular gap therebetween, the annular gap being the gas inlet 160. Gas feed orifices 230 in the back plate 205 are sized to provide the precise gas flow desired extend vertically from the gas manifold 170 overlying the back plate 205 to the annular gas inlets 160. Since the gas distribution plate 110 consists of an array of hundreds or thousands of annular inlets 160 to achieve spatially uniform gas distribution across the entire wafer surface, the inlets 160 would in most cases allow too much gas flow. Therefore, the finely-sized orifices 230 provide the requisite flow control.

Significantly, each orifice 230 faces a horizontal gap 235 between the respective puck 220 and the back plate 205, so that the gas is forced to make an abrupt turn to enter the gap 235 and another abrupt turn to enter the annular inlet 160. It is difficult if not impossible for plasma in the chamber travelling upward in the annular inlets 160 to make both of these turns without being extinguished by collisions with the gas distribution plate surfaces within the annular inlet 160 and the horizontal gap 235. A result is that the precisely sized orifices 230 are protected from plasma sputtering. This leaves only the annular inlets 160 subject to distortion in size from plasma sputtering or attack. However, the area of each annular inlet 160 is so large that plasma sputtering introduces only a small fractional difference in area from inlet to inlet, so that gas distribution uniformity across the wafer surface is virtually immune to such changes. Moreover, in the embodiment of FIGS. 2A and 2B, gas flow uniformity is determined by the uniformity of the orifices 230 only, so that changes in the sizes of the various annular inlets 160 have virtually no affect on gas flow uniformity. Thus, performance of the gas distribution plate 110 is virtually immune to changes induced by plasma sputtering or attack, a significant advantage.

In one embodiment, the back plate 205 and front plate 210 are formed of silicon carbide and are bonded together using existing techniques in silicon carbide manufacturing. One advantage of using silicon carbide as the material of the gas distribution plate 110 is that such material is practically impervious to attack by certain process gases and plasma species, such as halogen-containing process gases and plasma species. Also, silicon carbide is relatively compatible with silicon semiconductor wafer processing, so that contamination from plasma sputtering of such material is not as harmful as are other materials such as aluminum.

Another advantage of the annular-shaped gas inlets 160 is that each puck 220 keeps the plasma ions and gases away from the center of each opening 215 where electric fields are maximum. This feature helps prevent arcing or plasma light-up. The two plate structure 205, 210 of the gas distribution plate 110 enables cost effective manufacture of hundreds or thousands of holes 215 and pucks 220 centered in each of the holes. The invention thus provides an economical gas distribution plate with sufficient uniformity of gas distribution to process extremely fine device features (e.g., 0.15 microns) on a very large wafer (10 inch to 20 inch diameter) with minimal plasma arcing while being impervious to long term wear from plasma sputtering.

Another advantage is that the relatively large annular openings 160 provide a much lower gas injection velocity.

Although each finely sized orifice 230 produces a very high velocity gas stream into the respective horizontal gap 235, passage through the horizontal gap 235 and through the large annular inlet 160 dissipates its velocity. As a result, the gas flow from the bottom of the front plate 210 is much more uniform and free from high velocity narrow gas streams and plasma plumes. Therefore, a small wafer-to-ceiling gap does not lead to spatial non-uniformities in the gas distribution at the wafer surface using the gas distribution plate 110, a significant advantage.

Many of the advantages enumerated above are pertinent to problems encountered in high power plasma reactors capable of high plasma ion densities. One of these problems is that high plasma ion density over the wafer surface is achieved in some reactors by a small wafer-to-ceiling gap to better confine the plasma. As noted above, the gas distribution plate 110 provides uniform gas distribution within such a small gap because of the large size of the annular inlets 160. Another one of these problems is that high plasma ion density is achieved in some reactors by applying plasma source power to the ceiling or overhead gas distribution plate, which leads to arcing in the gas inlets. As noted above, the gas distribution plate 110 includes the pucks 220 that confine the gas closer to the periphery of each hole 215 where electric fields are minimum so as to suppress or prevent arcing. Thus, the gas distribution plate 110 is inherently suitable for use in high density plasma reactors.

Figure 3A:
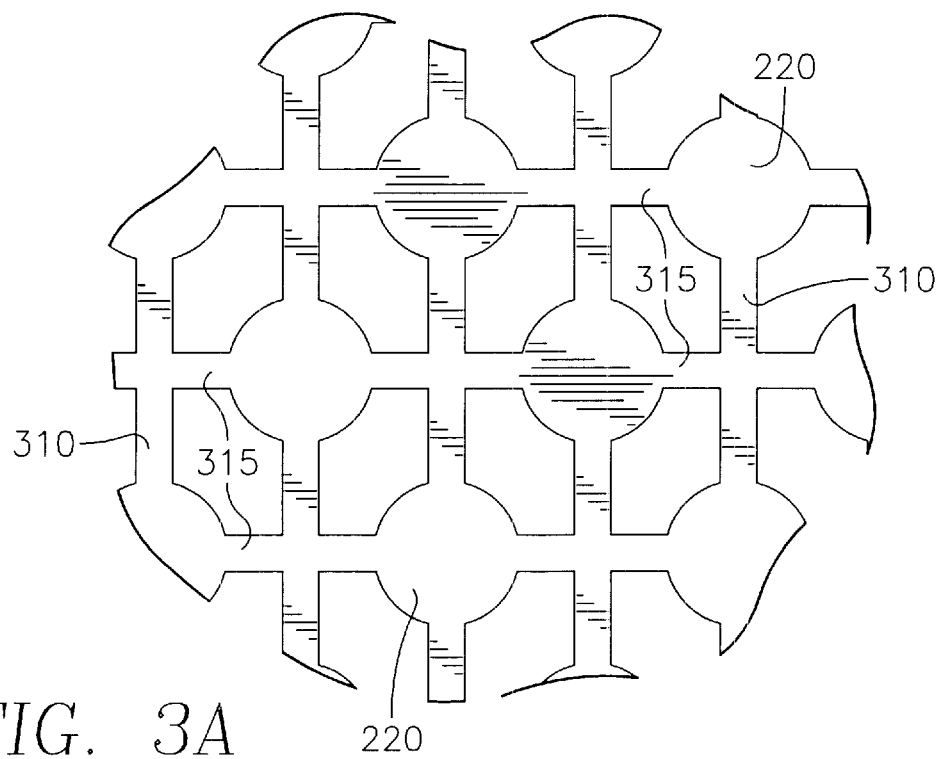
FIG. 3A is a plan view of one implementation of the front plate of the gas distribution plate of FIG. 2B.
Figure 3B:
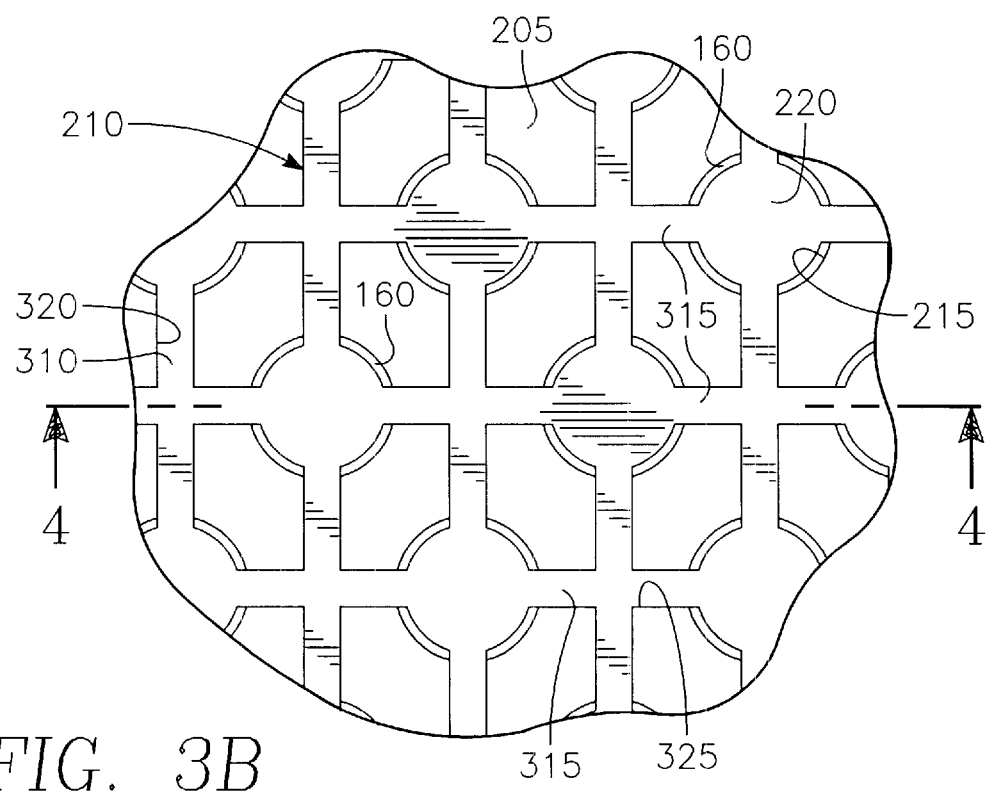
FIG. 3B is a plan view of the front plate of FIG. 3A bonded to the back plate in accordance with this implementation.
Figure 4:
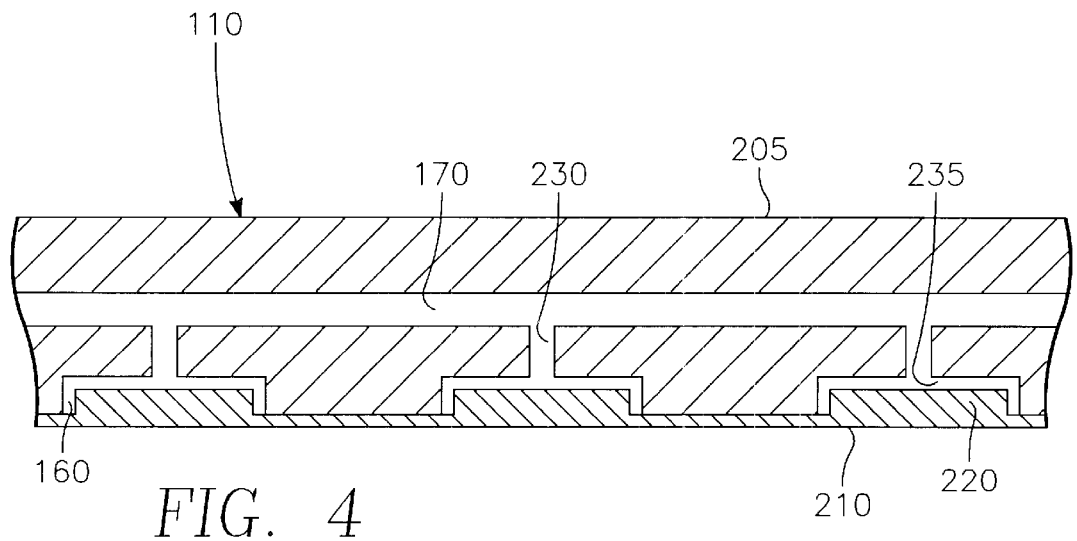
FIG. 4 is a cross-sectional side view of the assembly of FIG. 3B corresponding to lines 4—4 of FIG. 3B.

FIGS. 3A, 3B and 4 illustrate one implementation of the embodiment of FIGS. 2A and 2B. FIG. 3A shows that the front plate 210 having the array of pucks 220 consists of a web of longitudinal arms 310 and lateral arms 315 formed with the pucks 220 and holding them in the fixed array. Referring to FIGS. 3B and 4, the back plate 205 has longitudinal channels 320 and lateral channels 325 that receive the longitudinal and lateral arms 310, 315 when the plates 205, 210 are joined together. The pucks 220 are centered in the respective holes 215 and spaced apart from the back plate 205 by the horizontal gaps 235 and the annular inlets 160 and therefore do not contact the back plate 205. Contact between the back plate 205 and the front plate 210 is along the longitudinal and lateral arms 310, 315 that fit snugly within the corresponding longitudinal and lateral channels 320, 325. It is along these contacting surfaces that the two plates 205, 210 are bonded together. As noted previously above, if the two plates are silicon carbide material, then the bonding is carried out using standard silicon carbide bonding techniques.

Figure 5:
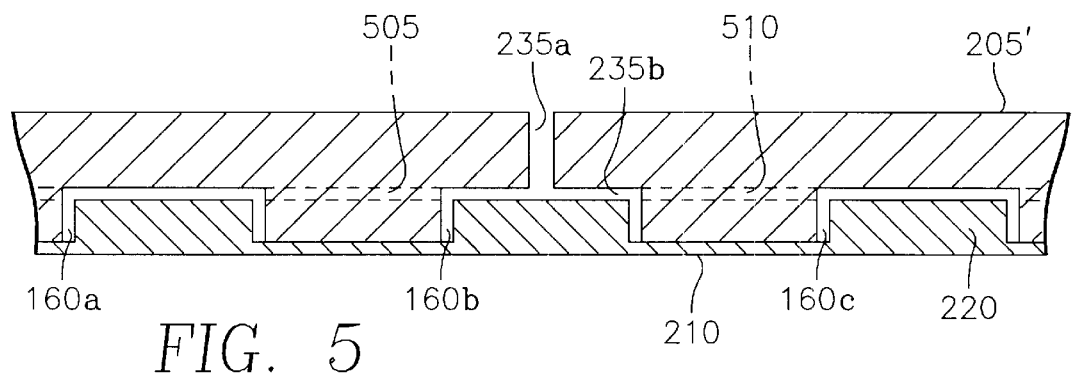
FIG. 5 is a cross-sectional side view of a gas distribution plate of the plasma reactor of FIG. 1 in accordance with a second embodiment.

FIG. 5 illustrates an embodiment in which a single orifice 235a feeds a group of neighboring annular gas inlets 160a, 160b, 160c. The single orifice 235a feed the middle annular gas inlet 160b directly via the horizontal gap 235b, and feeds the adjacent annular inlets 160a, 160c through internal channels 505, 510 connecting the adjacent annular inlets 160a, 160c with the middle annular inlet 160b. One advantage of this embodiment is that the number of finely sized orifices 235 that must be drilled in the back plate 205 is greatly reduced.

Figure 6:
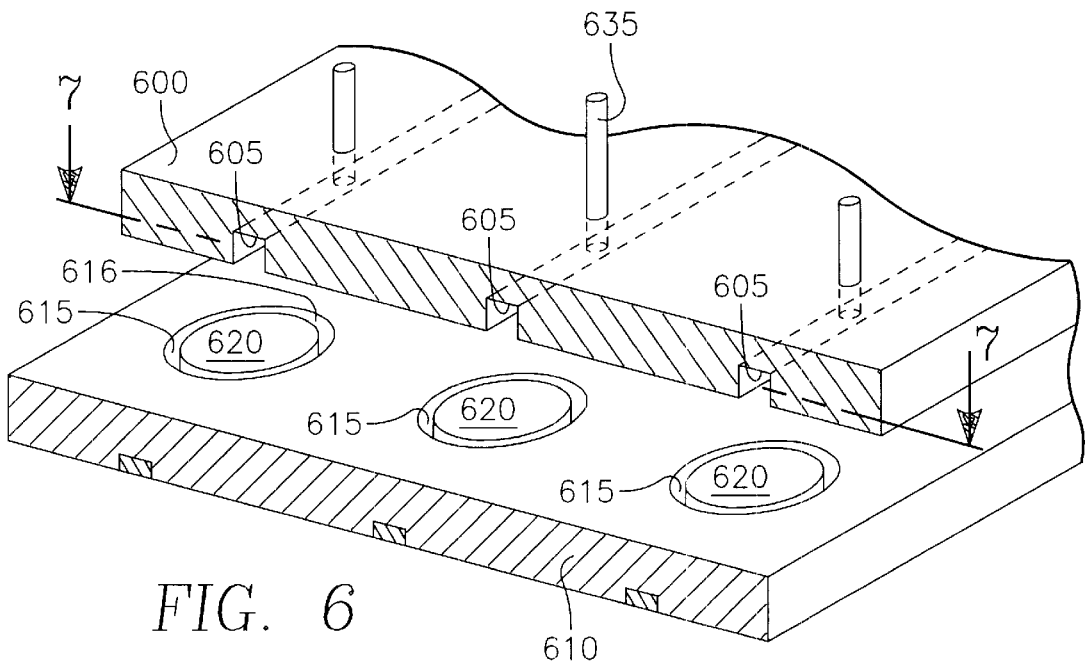
FIG. 6 is a cut-away partially exploded perspective view of a gas distribution plate of the plasma reactor of FIG. 1 in accordance with a third embodiment.

FIG. 6 illustrates an embodiment in which a back plate 600 has parallel lateral slots 605 and a front plate 610 has an array of holes 615 and pucks 620. The circular holes 615 and the cylindrical pucks 620 are concentrically arranged so that they define corresponding annular gas ports 616. The slots 605 are aligned with respective rows of the holes 615 and pucks 620. The width of each slot 605 is less than the diameter of each hole 615 (e.g., less than half). The plates 600, 610 are joined together so that each slot 610 is centered with a respective row of the array of holes 615. Referring to the cross-sectional view of FIG. 7, the resulting gas passage aligned with each hole 615 consists of a pair of arcuate slots 630a, 630b which appear in FIG. 7 in solid line. Process gas is fed into each slot 605 by a single fine orifice 635 through the back plate 600. The diameter of the orifice 635 is selected to provide the requisite gas flow rate.

Figure 7:
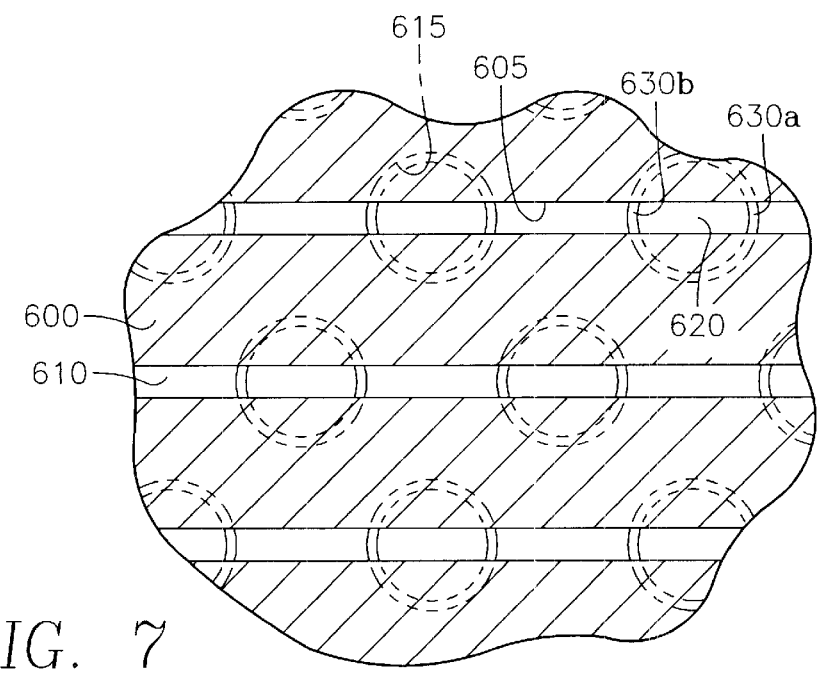
FIG. 7 is a cross-sectional view corresponding to lines 7—7 of FIG. 6.

The embodiment of FIGS. 6 and 7 is simpler to form because there is no horizontal gap (e.g., the horizontal gap 235 of FIG. 2) between the puck 620 and the back plate 600. Instead, the bond between the plates 600, 610 is formed along the entirety of their adjoining surfaces. The pucks 620 are similarly bonded across the entirety of their top surfaces to the bottom surface of the plate 600. The only areas of the top surfaces of the pucks 620 not thus bonded are the areas facing the narrow slots 605.

In the foregoing embodiments, the pucks 620 function as flow diversion elements for transforming gas flow between the front and back plates 610, 600 from stream patterns in the back plate 600 to annular flow patterns in the front plate 610. The stream patterns correspond to a first radius (i.e., the radius of the top orifices 635) and the annular patterns correspond to a second radius (i.e., the radius of each annular opening 660) which is larger than the first radius. The flow diversion elements 620 induce a rapid change of gas flow (a) from a vertical flow of the stream pattern in each orifice 635 (b) to a horizontal flow from the first radius (of each orifice 635) to the second radius (of the corresponding annular opening 660) and (c) to a vertical flow in each corresponding annular opening 660.

Figure 8A:
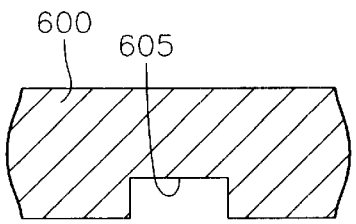
FIGS. 8A, 8B, 8C and 8D are sequential cut-away partial side views of one portion of a gas distribution plate of FIG. 6, illustrating a first process for fabricating the gas distribution plate of FIG. 6.
Figure 8B:
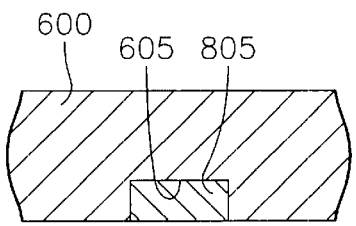
Figure 9B:
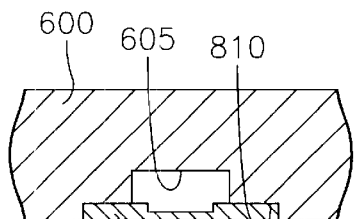
Figure 8C:
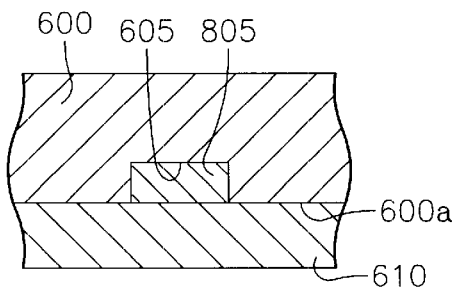
Figure 9C:
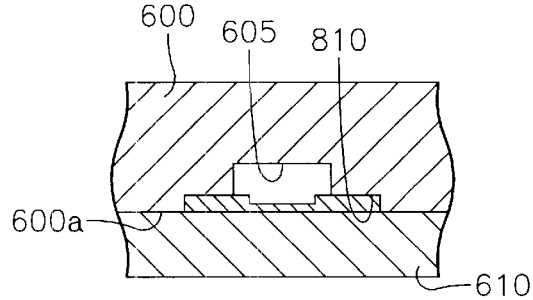
Figure 8D:
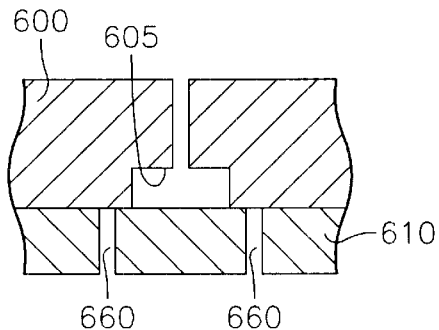
Figure 9D:
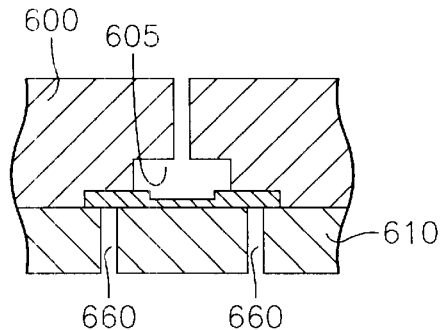

FIGS. 8A–8D illustrate one method for fabricating the gas distribution plate of FIGS. 6 and 7 as a monolithic silicon carbide piece. In FIG. 8A, the back plate 600 is formed of sintered silicon carbide and the slots 605 are milled in the plate 600. In FIG. 8B, graphite inserts 805 are placed in the slots 605. In FIG. 8C, the front plate 610 is formed by chemical vapor deposition of silicon carbide on the bottom surface 600a of the back plate 600. Then, the graphite inserts are all removed by heating the entire assembly until the graphite material burns away, leaving the slots 605 empty, as shown in FIG. 8D. In FIG. 8D, an array of annular openings 660 are milled completely through the entire thickness of the front plate 610, corresponding to the holes 615 and pucks 620 illustrated in FIG. 6. FIG. 8D also depicts the orifice 635, which may be milled during one of the foregoing steps.

Figure 9A:
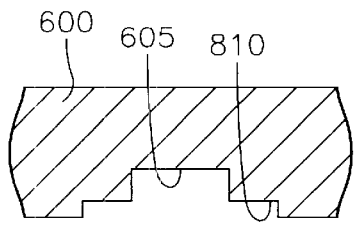
FIGS. 9A, 9B, 9C and 9D are sequential cut-away partial side views of one portion of a gas distribution plate of FIG. 6, illustrating a second process for fabricating the gas distribution plate of FIG. 6.

FIGS. 9A–9D illustrate another method for fabricating the gas distribution plate of FIGS. 6 and 7 as a monolithic silicon carbide piece. In FIG. 9A, the back plate 600 is formed of sintered silicon carbide and the slots 605 are milled in the plate 600. In addition, a wide shallow channel 810 is formed in the back plate 600 centered along and parallel to each slot 605. In FIG. 8B, silicon carbide inserts 815 are placed in the wide shallow slots 810. In FIG. 8C, the front plate 610 is formed by chemical vapor deposition of silicon carbide on the bottom surface 600a of the back plate 600. In FIG. 8D, an array of annular openings 660 are milled completely through the combined thicknesses of the front plate 610 and the silicon carbide inserts 815, corresponding to the holes 615 and pucks 620 illustrated in FIG. 6.

Figure 10:
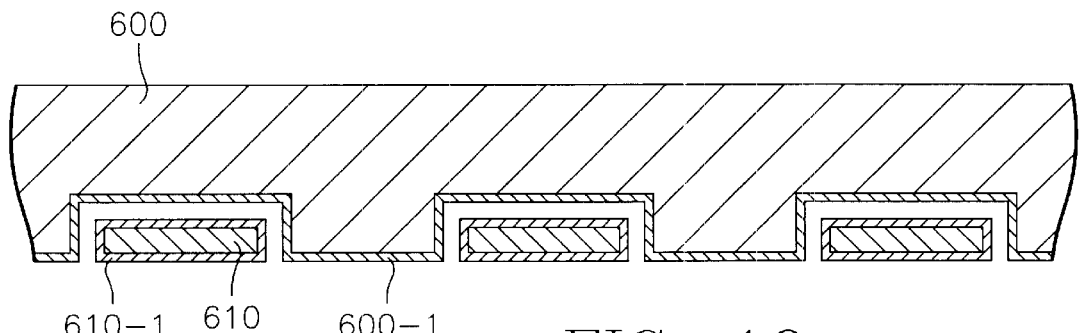
FIG. 10 is a cross-sectional side view of a gas distribution plate of the plasma reactor of FIG. 1 in accordance with a third embodiment.

FIG. 10 illustrates yet another embodiment in which the back plate 600 and the front plate 610 are both formed of anodized aluminum. The anodization produces an alumina thin film 600-1 on the back plate 600 and an alumina thin film 610-1 on the front plate 610. The anodization layer protects the aluminum plates from the plasma.

While the invention has been described with reference to embodiments in which the ceiling gas distribution plate must function as an electrode (and therefore comprise conductive material), the gas distribution plate of the invention is also well suited to applications in which the gas distribution plate does not function as an electrode.

Figure 11:
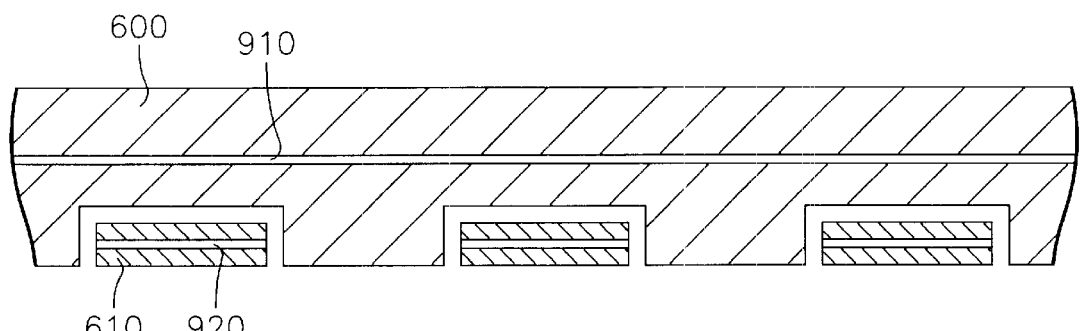
FIG. 11 is a cross-sectional side view of an alternate gas distribution plate as shown in FIG. 10.

In those embodiments in which the ceiling gas distribution plate functions as an overhead electrode, it may consist of silicon carbide, as described above. If it is desired that the gas distribution plate have a resistivity less than that of silicon carbide (0.005–1.0 Ohm-cm), then each of the silicon carbide plates 600, 610 may be fabricated in such a manner as to have a thin highly conductive graphite layers 910, 920 running through the center of the plates and coplanar with the respective plate, as illustrated in FIG. 11. This is accomplished by forming each plate 600, 610 as a graphite plate. Each graphite plate is machined to form the structural features described above with reference to FIGS. 6 and 7. Then, each graphite plate 600, 610 is siliconized using conventional techniques. However, the siliconization process is carried out only partially so as to siliconize the graphite plates to a limited depth beyond the external surface of the graphite. This leaves an interior portion of the graphite un-siliconized, corresponding to the graphite layers 910, 920 enclosed within the silicon carbide plates 600, 610. The graphite layers 910, 920 have a resistivity about one order of magnitude less than that of silicon carbide. Since the graphite layers 910, 920 are completely enclosed in silicon carbide, they are protected from the plasma.

While the gas distribution plate of FIGS. 2A and 2B has been described as being formed of silicon carbide, it may, instead, be formed of silicon.

While the invention has been described in detail with reference to preferred embodiments, it is understood that variations and modifications thereof may be made without departing from the true spirit and scope of the invention.

What is claimed is:

1. A gas distribution plate assembly comprising:
   a front plate having a front surface, a back surface, and a plurality of holes, wherein each hole extends completely through the front plate from the back surface to the front surface of the front plate;
   a back plate having a front surface, a back surface, and a plurality of gas inlet orifices;
   wherein the front surface of the back plate is characterized by alternating protruding areas and recessed areas;
   wherein each orifice extends completely through the back plate from the back surface of the back plate to a corresponding one of the recessed areas of the front surface of the back plate; and
   wherein the protruding areas are arranged so as to permit the front surface of the back plate to be positioned adjacent the back surface of the front plate so that each protruding area of the back plate is within one of the holes of the front plate and so that said protruding areas and said holes collectively form a plurality of annular gas passages extending through the front plate.

2. A gas distribution plate assembly according to claim 1 wherein:
   each annular gas passage is characterized by a first radius;
   each orifice is characterized by a second radius; and
   the first radius is substantially larger than the second radius.

3. A gas distribution plate assembly according to claim 1, wherein each annular gas passage has an opening large enough so that any gas flowing through both the gas inlet orifices and the annular gas passages has a much higher velocity through the orifices than through the annular gas passages.

4. A gas distribution plate assembly according to claim 1, wherein:
   each orifice has a first end and a second end at the back surface and the front surface, respectively, of the back plate; and
   the gas inlet orifices are arranged so that the second ends of the orifices are equally spaced in a two-dimensional array distributed over the front surface of the back plate.

5. A gas distribution plate assembly according to claim 1, wherein the back plate and front plate are composed of silicon carbide.

6. A gas distribution plate assembly according to claim 1, wherein the back plate and front plate are composed of graphite.

7. A gas distribution plate assembly according to claim 1, wherein the back plate and front plate are composed of graphite having a siliconized outer layer.

8. A gas distribution plate assembly comprising:
   a front plate having a front surface, a back surface, and a plurality of openings, wherein each opening extends completely through the front plate from the back surface to the front surface of the front plate; and
   a back plate having a front surface, a back surface, and a plurality of gas inlet orifices;
   wherein the front surface of the back plate is characterized by alternating protruding areas and recessed areas;
   wherein each orifice extends completely through the back plate and has a first end at the back surface of the back plate and a second end at one of the recessed areas of the front surface of the back plate; and
   wherein the orifices are arranged so as to permit the front surface of the back plate to be positioned adjacent the back surface of the front plate so that the second end of each orifice of the back plate is offset, in a direction parallel to the back surface of the front plate, from any of the openings of the front plate.

9. A gas distribution plate assembly according to claim 8, wherein:
   the gas inlet orifices are arranged so that the second ends of the orifices are equally spaced in a two-dimensional array distributed over the front surface of the back plate.

10. A gas distribution plate assembly according to claim 8, wherein the back plate and front plate are composed of silicon carbide.

11. A gas distribution plate assembly according to claim 8, wherein the back plate and front plate are composed of graphite.

12. A gas distribution plate assembly according to claim 8, wherein the back plate and front plate are composed of graphite having a siliconized outer layer.

13. A gas distribution plate assembly comprising:
   (a) a front plate having a front surface, a back surface, and a plurality of openings, wherein
       (i) each opening extends completely through the front plate from the back surface to the front surface of the front plate, and
       (ii) the back surface of the front plate has a solid surface area extending between each of the openings; and
   (b) a back plate having a front surface, a back surface, and a plurality of gas inlet orifices, wherein
       (i) the front surface of the back plate is characterized by alternating protruding areas and recessed areas,
       (ii) each orifice extends completely through the back plate and has a first end at the back surface of the back plate and a second end at one of the recessed areas of the front surface of the back plate, and (iii) the orifices are arranged so as to permit the front surface of the back plate to be positioned adjacent the back surface of the front plate so that the second end of each orifice is aligned with said solid surface area of the back surface of the front plate.

14. A gas distribution plate assembly comprising:

a front plate having a front surface, a back surface, and a plurality of openings, wherein each opening extends completely through the front plate from the back surface to the front surface of the front plate; and a back plate having a front surface, a back surface, and a plurality of gas inlet orifices;

wherein the front surface of the back plate is characterized by alternating protruding areas and recessed areas;

wherein each orifice extends completely through the back plate and has a first end at the back surface of the back plate and a second end at one of the recessed areas of the front surface of the back plate; and wherein the orifices are arranged so as to permit the front surface of the back plate to be positioned adjacent the back surface of the front plate so that the second end of each orifice of the back plate is equidistant from at least two openings of the front plate that are closest to said orifice.

* * * * *